US012573933B2

(12) United States Patent
Van De Rijdt et al.

(10) Patent No.: US 12,573,933 B2
(45) Date of Patent: Mar. 10, 2026

(54) ACTUATOR DEVICE FOR USE IN A POSITIONING SYSTEM AS WELL AS SUCH POSITIONING SYSTEM

(71) Applicant: VDL Enabling Technologies Group B.V., Eindhoven (NL)

(72) Inventors: Johannes Hubertus Antonius Van De Rijdt, Eindhoven (NL); Francesco Patti, Eindhoven (NL); Jorrit Fedde Bloemhof, Eindhoven (NL); Rob Antonius Andries Verkooijen, Eindhoven (NL); Bob Van Ninhuijs, Eindhoven (NL); Roel Adrianus Jacobus Van Mil, Eindhoven (NL)

(73) Assignee: VDL Enabling Technologies Group B.V., Eindhoven (NL)

( * ) Notice: Subject to any disclaimer, the term of this patent is extended or adjusted under 35 U.S.C. 154(b) by 0 days.

(21) Appl. No.: 18/663,918

(22) Filed: May 14, 2024

(65) Prior Publication Data

US 2024/0339910 A1 Oct. 10, 2024

Related U.S. Application Data

(63) Continuation of application No. 17/790,368, filed as application No. PCT/NL2020/050811 on Dec. 21, 2020, now Pat. No. 12,021,432.

(30) Foreign Application Priority Data

Dec. 31, 2019 (NL) ........................................ 2024595
Mar. 16, 2020 (NL) ..................................... 2025135

(51) Int. Cl.
B65G 54/02 (2006.01)
G03F 7/00 (2006.01)
(Continued)

(52) U.S. Cl.
CPC ........... H02K 41/031 (2013.01); B65G 54/02 (2013.01); G03F 7/70758 (2013.01);
(Continued)

(58) Field of Classification Search
CPC ..... B65G 54/02; G03F 7/70758; G03F 7/709; H01L 21/677; H01L 21/67703;
(Continued)

(56) References Cited

U.S. PATENT DOCUMENTS 6,445,093 B1 9/2002 Binnard
2004/0263000 A1 12/2004 Vreugdewater et al.
(Continued)

FOREIGN PATENT DOCUMENTS

JP 201496589 A 5/2014

*Primary Examiner* — Levi Gannon
(74) *Attorney, Agent, or Firm* — Procopio, Cory, Hargreaves & Savitch LLP

(57) ABSTRACT

The invention relates to an actuator device for use in a positioning system, wherein the actuator device is linearly movable within a plane with respect to a supporting structure of the positioning system as well as such a positioning system implementing such an actuator device.

In an example of the actuator device according to the invention, it comprises a carrier having a longitudinal and a transversal dimension; and multiple groups of coil assemblies mounted in the carrier, each group of coil assemblies being structured to orientate the carrier in at least one degree of freedom.

The single design actuator device according to the invention has limited constructional dimensions and allows high accuracy as to motion and position in multiple degrees of freedom.

20 Claims, 17 Drawing Sheets

(51) Int. Cl.

| | | |
|---|---|---|
| *H01L 21/677* | (2006.01) |
| *H01L 21/68* | (2006.01) |
| *H02K 41/03* | (2006.01) |

(52) U.S. Cl.
CPC .... *G03F 7/70816* (2013.01); *H01L 21/67709* (2013.01); *H01L 21/68* (2013.01); *H02K 2201/18* (2013.01)

(58) Field of Classification Search
CPC ... H01L 21/67709; H01L 21/68; H02K 41/03; H02K 41/031; H02K 2201/18
See application file for complete search history.

(56) References Cited

U.S. PATENT DOCUMENTS

| | | |
|---|---|---|
| 2007/0108848 A1 | 5/2007 | Hol et al. |
| 2012/0062866 A1 | 3/2012 | Binnard et al. |
| 2012/0328836 A1 | 12/2012 | Binnad et al. |
| 2013/0255414 A1 | 10/2013 | Bjork et al. |
| 2017/0010544 A1 | 1/2017 | Huang et al. |
| 2019/0302612 A1 | 10/2019 | Iwatani |

18A 120A-120F; 130A-130F 18A-18F 120A-120F; 130A-130F

1

ACTUATOR DEVICE FOR USE IN A POSITIONING SYSTEM AS WELL AS SUCH POSITIONING SYSTEM

BACKGROUND OF THE INVENTION

The invention relates to an actuator device for use in a positioning system, wherein the actuator device is linearly movable within a plane with respect to a supporting structure of the positioning system as well as such a positioning system implementing such an actuator device.

In product processing applications under high or low vacuum (or clean room) conditions, for example but not limited to wafer handling applications in the semiconductor manufacturing industry, an increasing demand for improved process reliability and stability as well as more accurate position handling combined with a higher throughput of products exists.

These requirements in vacuum operated product process environment set high standards with respect to the positioning and the orientation of a product, such as a wafer, during the many, subsequent process steps. In particular, vibrations created in the process line by moving mechanical parts and/or by the electrical component circuit may adversely affect the displacement and positioning accuracy of the product to be processed within the process line.

Reduction of vibrations can be realized by implementing magnetic bearing assemblies or magnetic coil assemblies or in short magnetic bearings. Given that magnetic bearings are contactless, there is no mechanical friction and thus limited vibrations. Moreover, there is no need for lubrication, which enables in vacuum operation without significant outgassing of molecular contamination. Apart from that, very little particle generation occurs, which is highly desirable in vacuum conditioned process applications. These aspects make that contamination seals can be omitted.

The main challenges of applying magnetic bearings or magnetic coil assemblies in high-tech in-vacuum systems lie in minimization of heat dissipation in the coils, minimizing eddy-current effects, implementation of a stable control system and linearization of the typically non-linear characteristics.

In current vibration-free positioning system designs magnetic coil assemblies are implemented as actuators for displacing and positioning a product, such as a wafer, along several degrees of freedom within a plane. Two actuator solutions can be recognized: first, direct motion axis, meaning that each axis (degree of freedom) has a single actuator, supported by separate sensor, and controls. In the second category, indicated as dual motion axis, one or more axis (degrees of freedom) have a stacked or two-staged motion control. The first stage deals with the "rough" or "less accurate" displacement and the final stage deals with the "accurate" positioning. In most known process applications all axis (degrees of freedom) are either direct motion or dual motion controlled.

Direct motion axis actuators are implemented in processes where (sub) μm accuracy is required with moderate accelerations exerted on the product to be processed. Dual motion axis actuators are applied in processes where (sub) nm accuracy with aggressive acceleration is required.

OBJECT OF THE INVENTION

It is an object to provide an improved actuator device, which integrates both direct motion axis as well as dual motion axis control, in one single design of limited constructional dimensions allowing implementation in product processing applications under high or low vacuum requiring high accuracy as to motion and position.

DESCRIPTION OF THE INVENTION

In an example of the actuator device according to the invention, it comprises a carrier having a longitudinal and a transversal dimension; and multiple groups of coil assemblies mounted in the carrier, each group of coil assemblies being structured to orientate the carrier in at least one degree of freedom.

The single design actuator device according to the invention has limited constructional dimensions and allows high accuracy as to motion and position in multiple degrees of freedom.

In an example the carrier is provided with multiple groups of one or more recesses, each group of one or more recesses structured to accommodate one or more coil assemblies belonging to one group of the multiple groups of coil assemblies.

In particular a first group of one or more recesses consist of four corner recesses, each corner recess being provided at or near a corner of the carrier. Each corner recess is provided with two through openings, wherein each corner recess is structured to accommodate a U-core coil assembly of a first group of coil assemblies, with each yoke of the U-core mounted through one of the corner through openings extending outward from the carrier surface and with a coil assembly of the first group of coil assemblies mounted around each yoke of the U-core. This first group of coil assemblies is arranged to control motion and position of the actuator device carrier in at least the z-degree of freedom.

In yet another advantageous example of the actuator device, a second group and a third group of one or more recesses for accommodating a second and third group of coil assemblies, respectively, are provided adjacent from each and between the first group of corner recesses, seen in the longitudinal dimension of the carrier. These second and third groups of coil assemblies are arranged to control motion and position of the actuator device carrier in at least the x-degree of freedom and y-degree of freedom, respectively.

In a particular example of the actuator device according to the invention the second group and/or the third group of one or more recesses consist of one recess, wherein the recesses of both the second and third group have a longitudinal dimension orientated parallel to the transversal dimension of the carrier. This allows for an easy machining of the carrier, and has advantageous thermal characteristics as to heat dissipation and cooling.

Preferably each coil assembly is accommodated in an insulated manner in each recess, thus preventing negative eddy-current effects.

In particular, each coil assembly is composed of a group of multiple single winded coils stacked together. This design guarantees a low thermal resistance, and results in a high fill factor coil and subsequently to a high accuracy as to motion and positioning.

In another example at least the second and/or the third group of the multiple coil assemblies is provided with at least one temperature sensor, in particular a PTC-resistor. Herewith a proper temperature control can be achieved, further improving stability of operation and preventing malfunction and/or disturbances which might adversely affect the motion and the positioning of the actuator device and product placed upon the actuator device.

To further improve the thermal characteristics of the carrier and thus improve the operation thereof within the positioning system, in an example the carrier comprises a channel for a coolant as well as an inlet and an outlet provided at respective ends of the channel.

In particular, starting from the inlet towards the outlet, the channel is in subsequent heat-exchanging contact with the first, the second and the third group of multiple coil assemblies. With this channel configuration it is emphasized to direct the coolant, which might be water, first over the group of multiple coil assemblies with the lowest heat dissipation, subsequently directing the coolant along longitudinal sides of the carrier-shaped actuator device and finally over the further groups of multiple coil assemblies located in the centre or middle of the actuator device between the first group of multiple coil assemblies, which further groups of multiple coil assemblies have the highest heat dissipation during operation.

In yet another advantageous example, the carrier is provided with a cover plate covering all recesses of the first, second and third group of recesses. This allows for an easy assembly as well as maintenance of the actuator device, wherein in a specific functional embodiment the channel for the coolant is provided in a surface of the cover plate facing the recesses.

Preferably the carrier is of a rectangular shape, however also other shapes such as a square shape are even effective and practical, in dependence on the product processing application.

An example of a positioning system for positioning an object in a plane comprises a supporting structure; an object table; a positioning module and implements an actuator device according to the invention, wherein the actuator device is structured to support the object table, and wherein the positioning module is structured to linearly move the actuator device together with the object table within a plane with respect to the supporting structure.

In particular the supporting structure comprises a first and a second elongated guide orientated parallel to each other, both first and second elongated guides comprising first and second groups of magnets positioned next to each other in opposite pole orientation.

In particular the magnets are permanent magnets or electromagnets and, during operation, the first and second group of magnets of the first and second elongated guides interact with the second and third group of coil assemblies of the actuator device, respectively. Herewith a proper position control can be achieved among the x-degree of freedom and the y-degree of freedom.

BRIEF DESCRIPTION OF THE DRAWINGS

The invention will now be described in more detail with reference to the accompanying drawings, which drawings show in.

DETAILED DESCRIPTION OF THE INVENTION

Figure 1A:
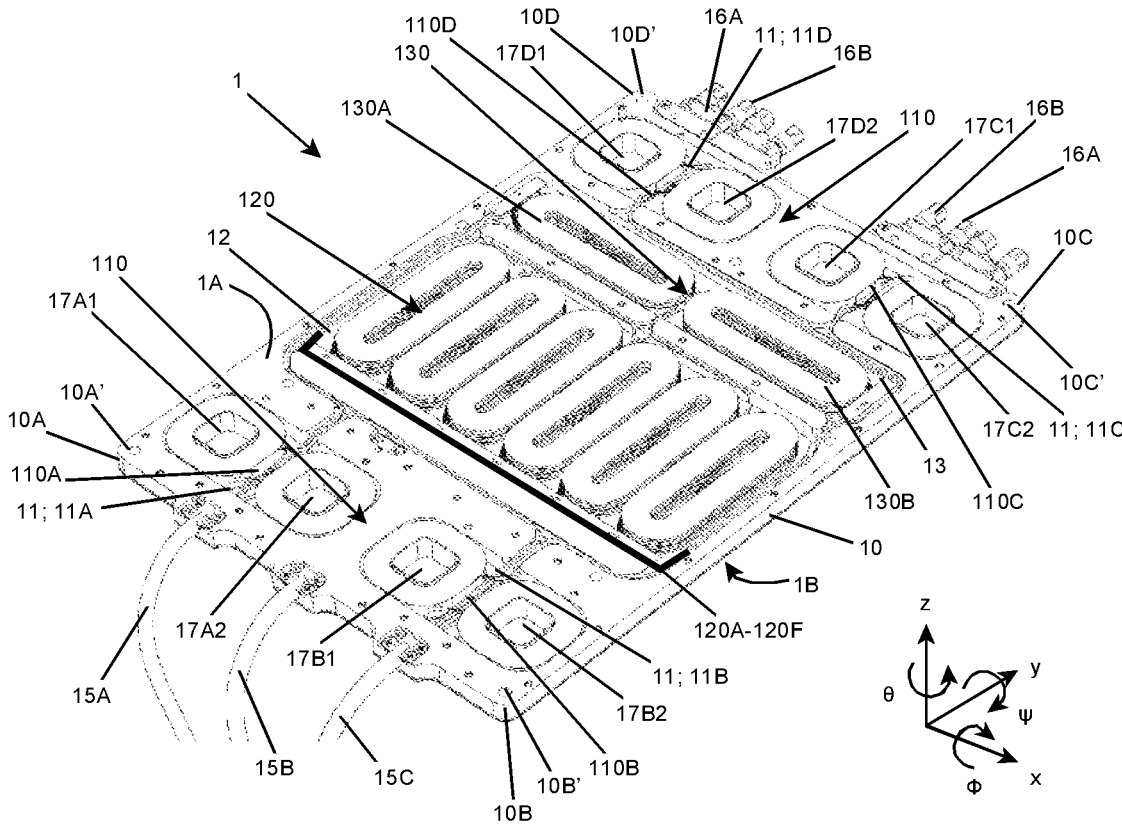
FIGS. 1A-1G several views of an embodiment of an actuator device according to the invention.

For a better understanding of the invention like parts in the drawings are denoted with like reference numerals.

FIGS. 1A-1G show several views of an embodiment of an actuator device according to the invention. The actuator device is indicated with reference numeral 1 and is in particular used in a positioning system, an example of such positioning system 20 being depicted in more detail in the FIGS. 3A-3C and 4A-4E.

In product processing applications under high or low vacuum (or clean room) conditions, for example but not limited to wafer handling applications in the semiconductor manufacturing industry, such an actuator device serves as a support for a wafer carrier carrying a wafer. The actuator device 1 together the wafer carrier and the wafer substrate placed upon it are linearly movable within a plane with respect to a supporting structure of the positioning system and within a processing chamber, allowing the wafer substrate to be subjected to—for example—several heat treatments and wafer deposition process steps or photolithography steps.

The actuator as depicted in FIGS. 1A-1E has a single design of limited constructional dimensions and allows implementation in product processing applications under high or low vacuum requiring high accuracy as to motion and position.

As shown in the Figures the actuator device 1 has a plane-shaped configuration with first surface side 1A and a second surface side 1B, located at the opposite side of the first surface side 1A of the actuator device 1. Preferably the actuator device 1 is composed as a carrier element 10, preferably manufactured as one piece element and made from a non-(ferro)-magnetic material, such as a plastic or aluminum. The carrier element or carrier 10 has a flat, plane-shaped configuration, with a thickness dimension z which is significantly smaller than its longitudinal dimension y and its transversal dimensions x. The carrier 10 can be of a rectangular shape with its longitudinal dimension y being larger than its transversal dimensions x (y>x) or can be formed as a square with x=y.

The single design actuator device 1 according to the invention has limited constructional dimensions and allows high accuracy as to motion and position in multiple degrees of freedom within a plane.

The actuator device 1 is provided with multiple groups of coil assemblies mounted in the carrier 10. In the embodiments of FIGS. 1A-1F three groups of coil assemblies are implemented in the actuator device 1, said first, second and third group of coil assemblies being denoted with reference numerals 110, 120 and 130 respectively. Each group of coil assemblies 110-120-130 operate as an actuator being structured to orientate the carrier 10 in at least one degree of freedom (six DOF x, y, z, $\phi$, $\psi$ and $\theta$).

See FIG. 1A-1B, 1E-1F for the three dimensional Cartesian coordinate system depicting the three orthogonal degrees of freedom (x, y and z directions of displacement) of the actuator device 1, as well as the three rotational degrees of freedom ($\phi$, $\psi$ and $\theta$ directions of rotation) of the actuator device 1 around its respective x, y and z directions of movement. This three dimensional Cartesian coordinate system applies for all embodiments depicted in the Figures.

Figure 1B:
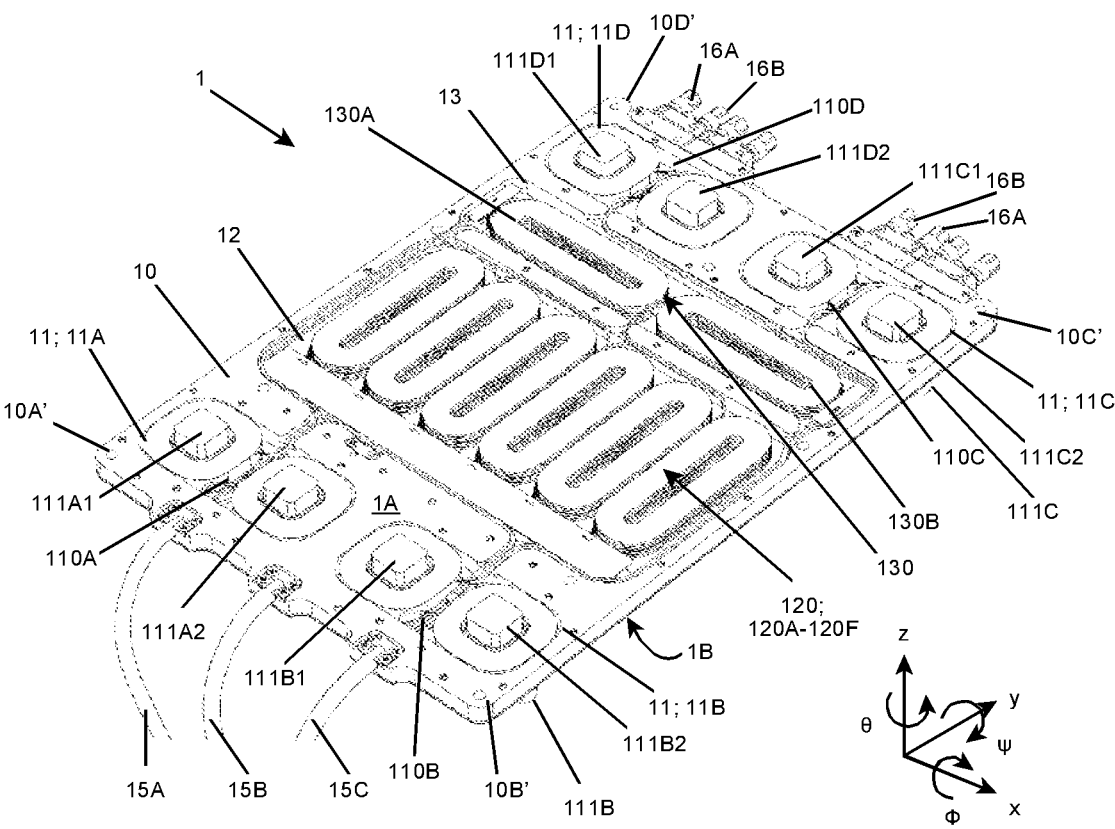
Figure 1C:
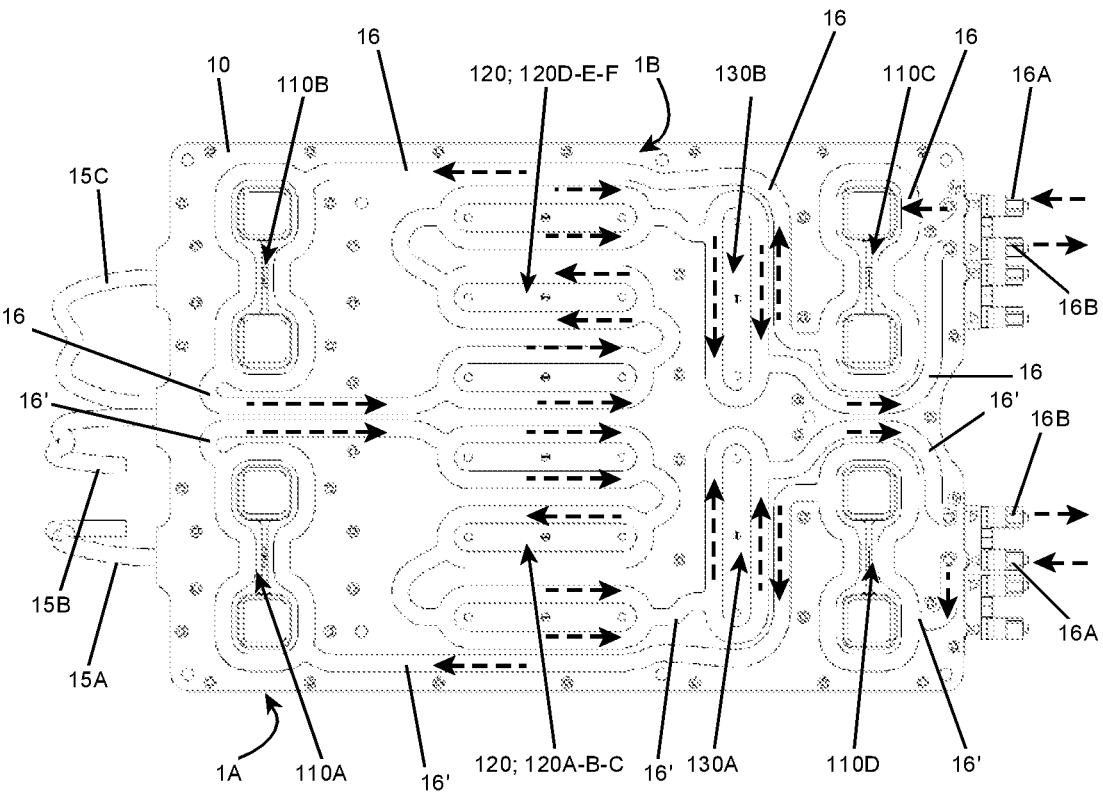
Figure 1D:
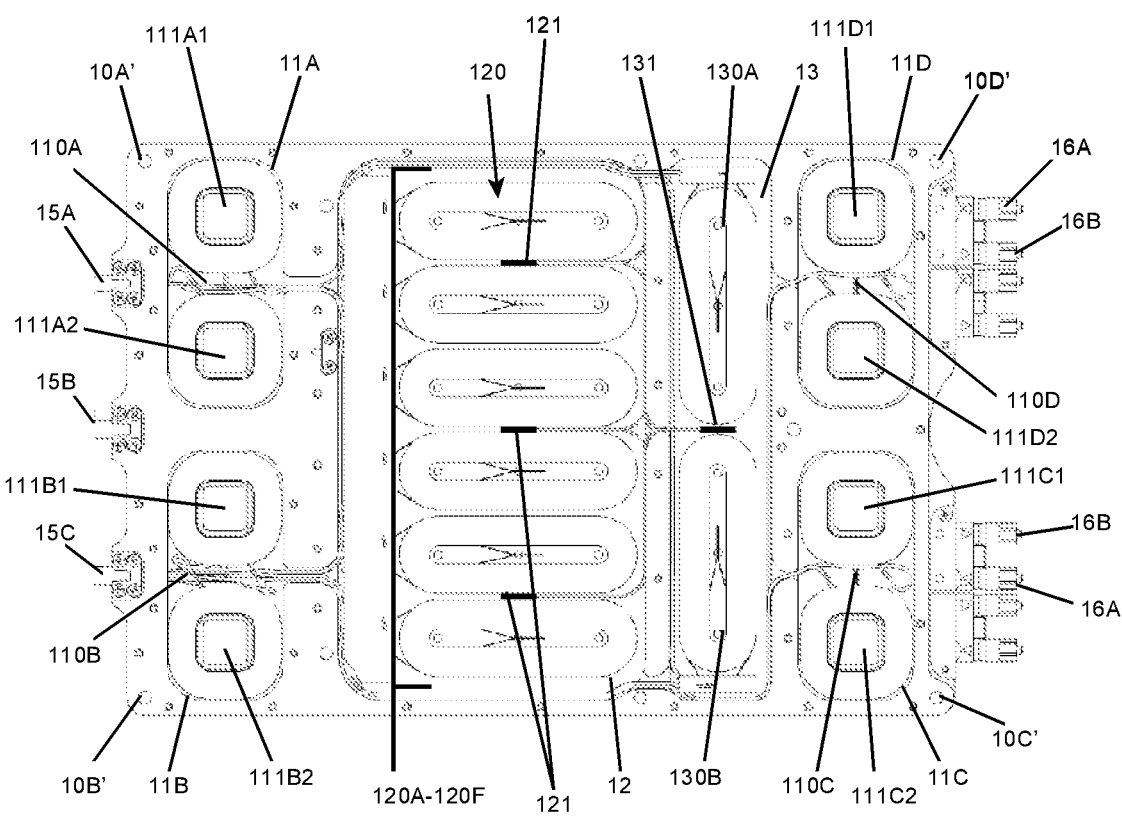
Figure 1E:
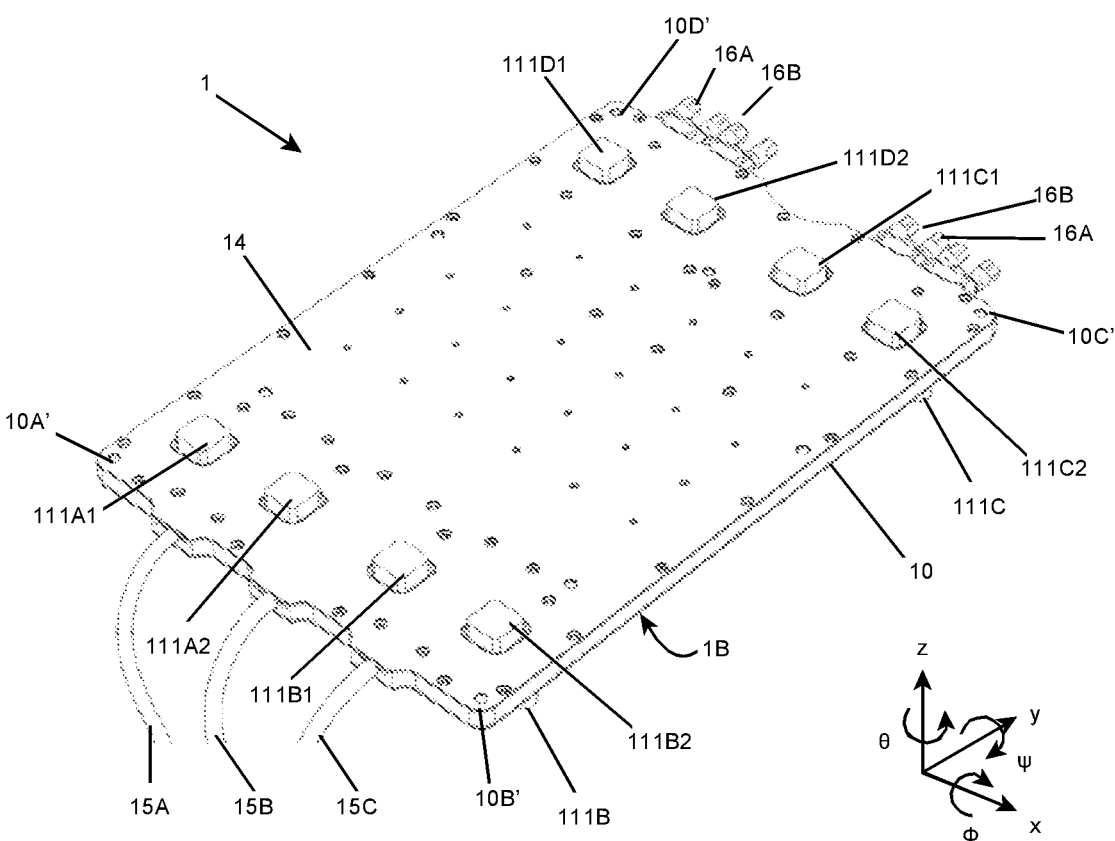
Figure 1F:
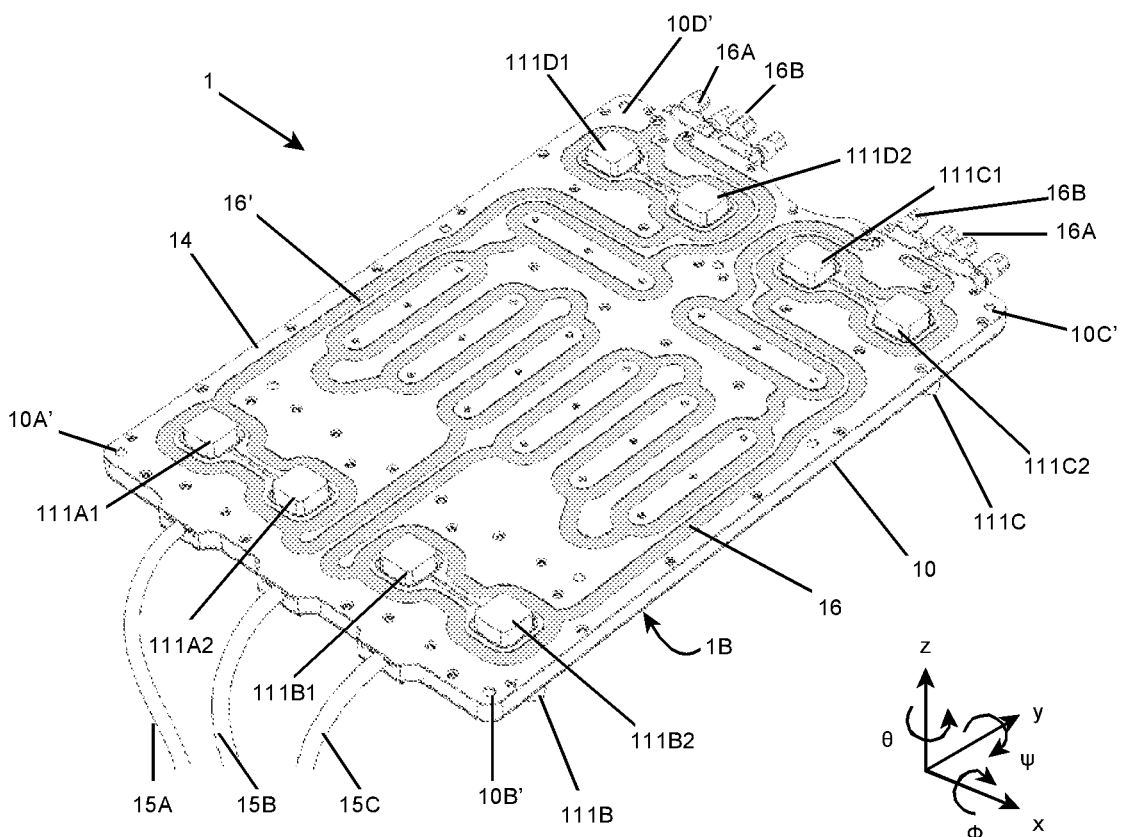
Figure 1G:
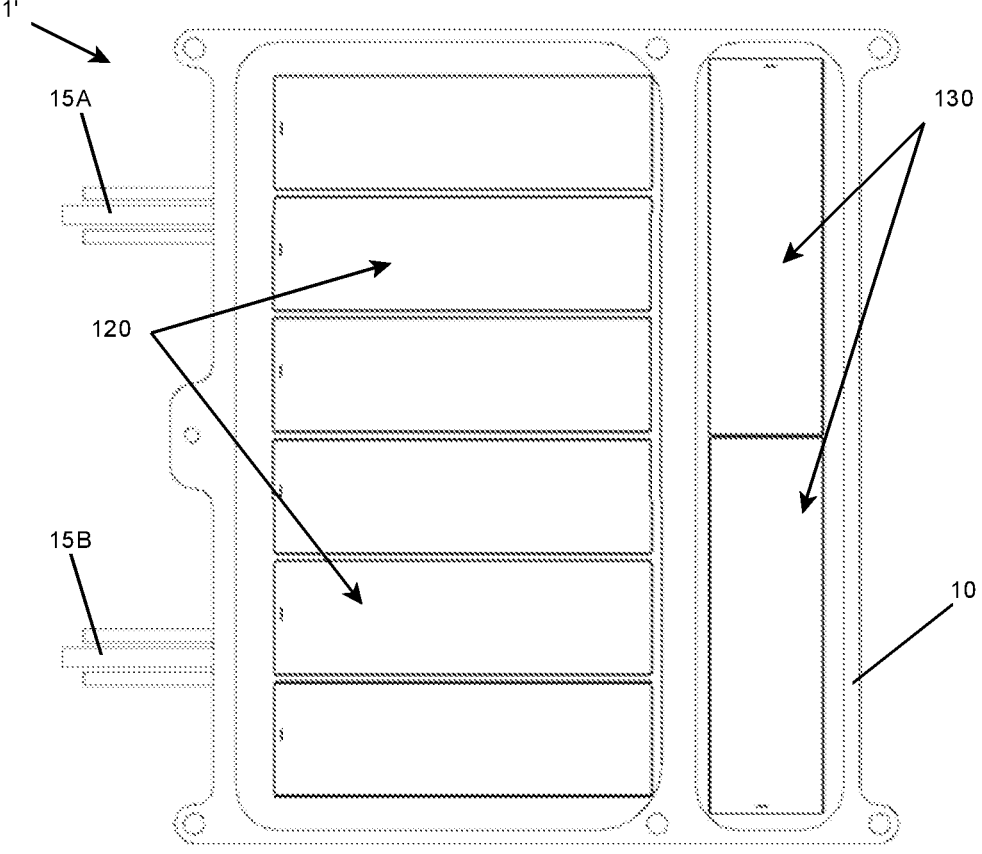

In the embodiment of FIG. 1G the actuator device 1' is provided with only two groups of coil assemblies 120-130, each group operating as an actuator being structured to orientate the carrier 10 in at least three degrees of freedom, among these three degrees of freedom are the x- and y-degree of freedom.

Returning to FIGS. 1A-1F, the carrier 10 is provided with multiple groups (here three groups) of one or more recesses, (the number of) said groups of recesses being conformal to (the number of) the groups of coil assemblies being implemented in the actuator device 1. The groups of recesses are provided in the first surface side 1A of the actuator device 1, preferably by means of machining or another material removing technique. The three groups of recesses in the embodiment shown in FIGS. 1A-1F are being indicated with reference numerals 11-12-13. And each group of one or more recesses 11-12-13 is structured to accommodate one or more coil assemblies belonging to one group of the multiple groups of coil assemblies 110-120-130.

Thus the first group of recesses 11 is structured to accommodate one or more coil assemblies belonging to the first group 110 of coil assemblies, whereas the second group of recesses 12 is structured to accommodate one or more coil assemblies belonging to the second group 120 of coil assemblies, and finally the third group of recesses 13 is structured to accommodate one or more coil assemblies belonging to the third group 130 of coil assemblies.

When looking in more detail to the first group of recesses 11 accommodating the coil assemblies belonging to the first group 110 of coil assemblies, it is noted that in this example the first group 11 consists of four corner recesses 11A-11B-11C-11D, with each corner recess 11A-11B-11C-11D being provided at or near a carrier corner 10A-10B-10C-10D of the carrier 10. In particular the corner recesses 11A-11B and 11C-11D are positioned next to each transversal side y of the carrier 10.

Furthermore each corner recess 11A-11B-11C-11D is provided with through openings 17A-17D, in particular each corner recess 11A-11B-11C-11D is provided with two through openings 17A1-17A2, 17B1-17B2, 17C1-17C2, 17D1-17D2 (or in simplified form 17 #1-17 #2 with # denoting A-D for the respective corner A-D).

Each corner recess 11A-11B-11C-11D is structured to accommodate a U-core coil assembly belonging to the first group of coil assemblies 110. These U-core coil assemblies are denoted with reference numerals 110A-110D and are depicted in more detail in FIG. 2D. U-core coil assemblies 110A-110D are each composed of two coil sections 110 #1-110 #2 (with # being A-D) being wound around respective winding cores 113 #1-113 #2 (again, with # being A-D), both coil sections 110 #1-110 #2 are electrically interconnected by means of a wire connection 114. Each winding core 113 #1-113 #2 is provided with the winding core openings 115 #1-115 #2, respectively.

Each U-core coil assembly 110A-110D furthermore comprises reluctance yokes 111A-111D, each yoke having two yoke legs 111 #1-111 #2 (with # being A-D). Each reluctance yoke is preferably made from a ferromagnetic material, such as steel or iron. As shown in FIGS. 1A-1B-1D-1E-1F combined with FIG. 2D, each yoke 111A-111D is mounted with its two yoke legs 111 #1-111 #2 through the corner through openings 17 #1-17 #2 of each corner recess 11A-11B-11C-11D. In particular the two yoke legs 111 #1-111 #2 each extend from the second surface side 1b through the corner through openings 17 #1-17 #2 and the winding core opening 115 #1-115 #2 of the winding core 113 #1-113 #2 outward from the first carrier surface 1A. Each coil section 110 #1-110 #2 of the coil assemblies 110A-110D of the first group 110 of coil assemblies is mounted around each yoke leg 111 #1-111 #2 of the yokes 111A-111D.

As shown in FIG. 1B, but also in FIGS. 1E, 1F, 3A, 3B, 3C, 4A and 4B the centre part of the U-shaped yokes 111A-111D extend below at the second side 1B of (the carrier 10 of) the actuator device 1.

The U-core coil assemblies 110A-110D function as reluctance coil actuators, being structured to orientate or position the carrier 10 in at least the z-degree of freedom. By actuating the U-core coil assemblies 110A-110D independent from each, it is herewith also possible to position the actuator 10 in the φ (rotation around the x-axis direction) degree of freedom and ψ (rotation around the y-axis direction) degree of freedom.

It is observed that in this example the first group of coil assemblies is comprised of four U-core coil assemblies 110A-110D, each being positioned and actuated near a corner of the carrier 10. This number is not to be limiting for the invention, as the number is arbitrary. It is noted however, that in other non-depicted examples of the invention the carrier 10 can be provided with less (for example two) or more (for example six or eight) U-core coil assemblies 110 # of the first group of coil assemblies (here, with # denoting A-B for the two-coils example or denoting A-F or A-H for the six- or eight-coils example). The number of the U-core coil assemblies belonging to the first group of coil assemblies can be arbitrary chosen dependent on the size of the carrier 10 and its application.

Likewise, the actuator device 1 as shown in FIGS. 1A-1F exhibit a second group 12 and a third group 13 of one or more recesses for accommodating a second group 120 and third group 130 of coil assemblies. These recesses 12 and 13 are provided in the first surface 1A of the carrier 10 of the actuator device 1, in such manner that they are positioned adjacent from each and are positioned between the first group of corner recesses 11A-11D, in particular between the corner recesses 11A-11B and 11C-11D, seen in the longitudinal x-dimension of the carrier 10.

In this particular example the second group and/or the third group of one or more recesses consist of one recess, indicated with reference numeral 12 and 13, respectively.

In particular the recesses 12-13 of both the second and third group have a longitudinal dimension, which is orientated parallel to the transversal x-dimension of the carrier 10. In fact the longitudinal dimension of the recesses 12-13 is orientated perpendicular to the longitudinal y-dimension of the carrier 10.

In the example shown in for example FIGS. 1A-1F the second group of coil assemblies 120 is being composed of six separate coil assemblies 120A-120F, and due to its orientation of the coil assemblies within the second recess 12 and with respect to the carrier 10, the second group 120 is being structured to orientate or position the carrier 10 in at least the x-degree of freedom.

Similarly, the third group of coil assemblies 130 is being composed of two separate coil assemblies 130A-130B, and due to its orientation of the coil assemblies within the third recess 13 and with respect to the carrier 10, the third group 130 is being structured to orientate or position the carrier 10 in at least the y-degree of freedom. Alternatively, by actuating the two coil assemblies 130A-130B independent from each, it is herewith also possible to position the actuator 10 in the θ (rotation around the z-axis direction) degree of freedom.

Similar to the arbitrary number of the U-core coil assemblies belonging to the first group of coil assemblies it should be noted that also the number of coil assemblies in each second 120 and third group 130 of coil assemblies is arbitrary and can be any number between 1 (preferably at least 2) and 8. In an example the third group of coil assemblies 130 can be composed of four separate coil assemblies 130A-130A'-130B-130B', with the coil assemblies 130A-130A' and 130B-130B' each grouped together in the longitudinal direction y of the carrier 10. The number of coils 120 # and 130 # can be dependent on the size of the carrier 10 and its application.

Each coil assembly 120A-120F and 130A-130B of the second group 120 and third group 130 of coil assemblies function in fact as permanent magnet Lorentz actuators.

Figure 2A:
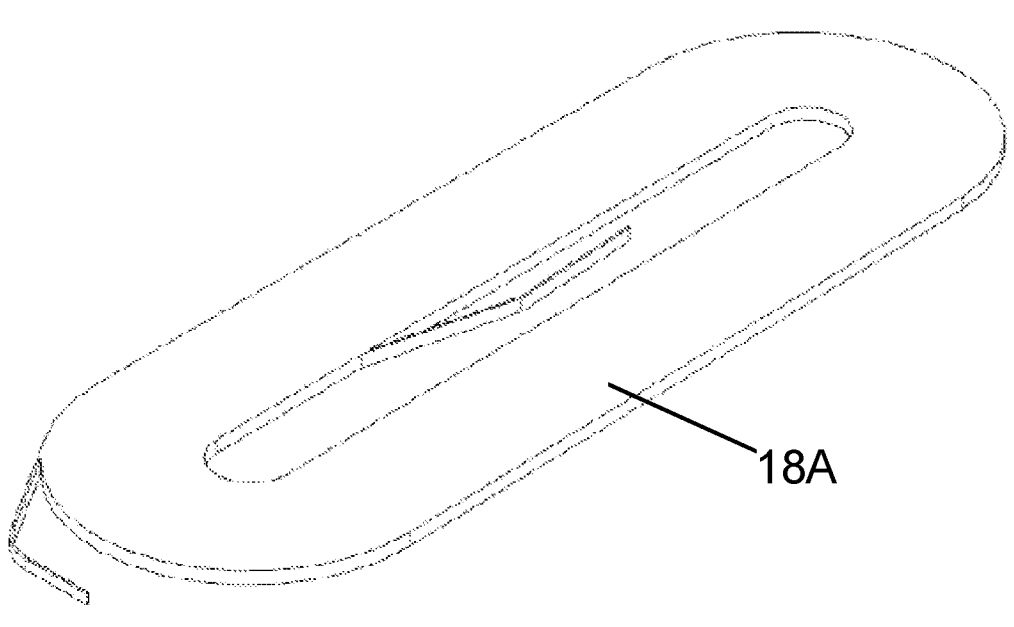
FIGS. 2A-2D several examples of electric coils used in the actuator device according to the invention.
Figure 2B:
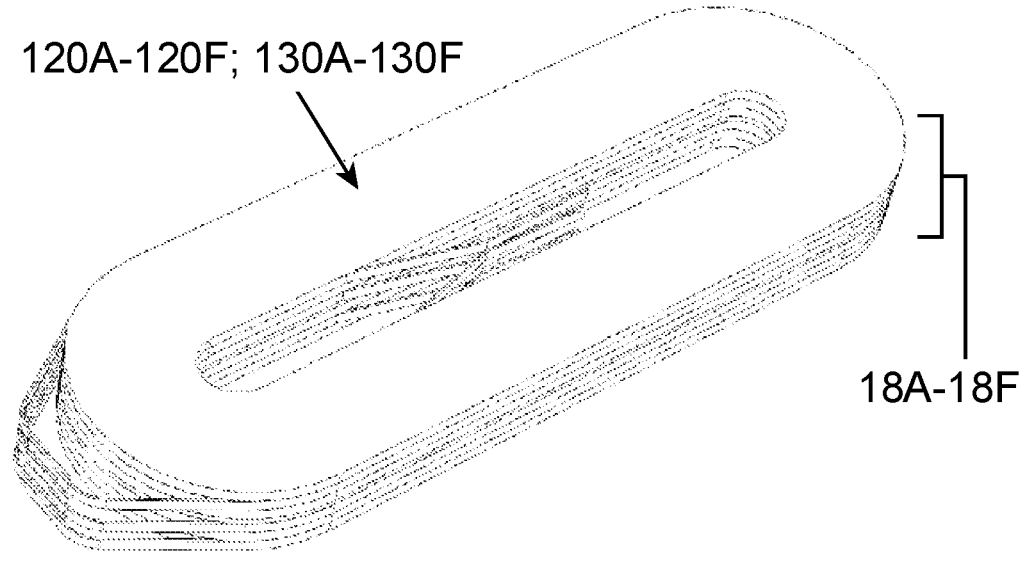
Figure 2C:
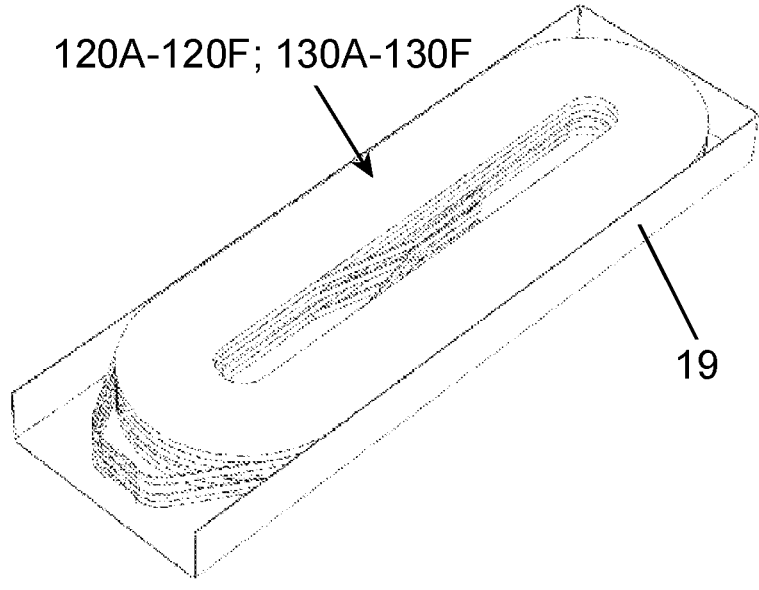
Figure 2D:
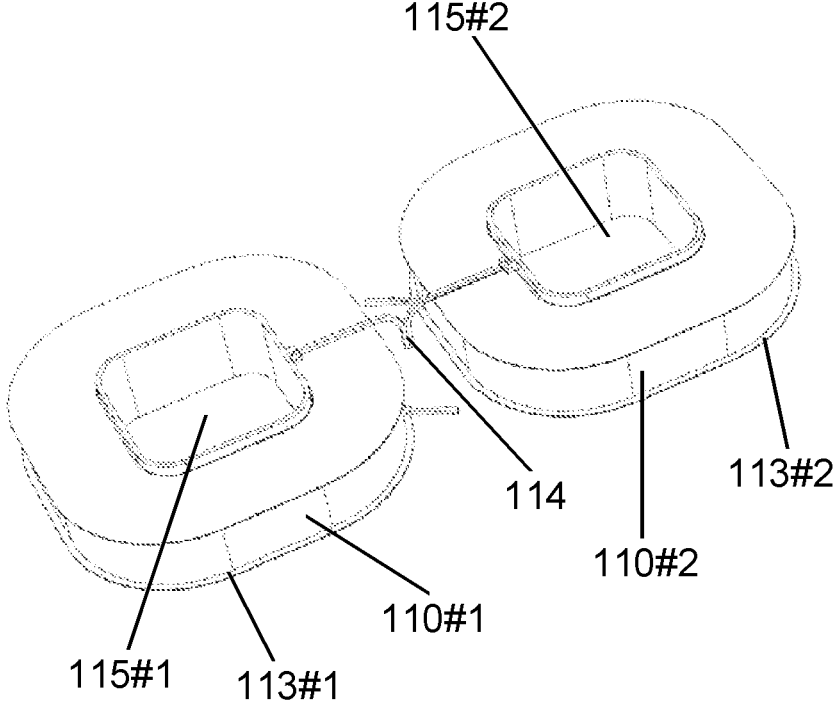
Figure 3A:
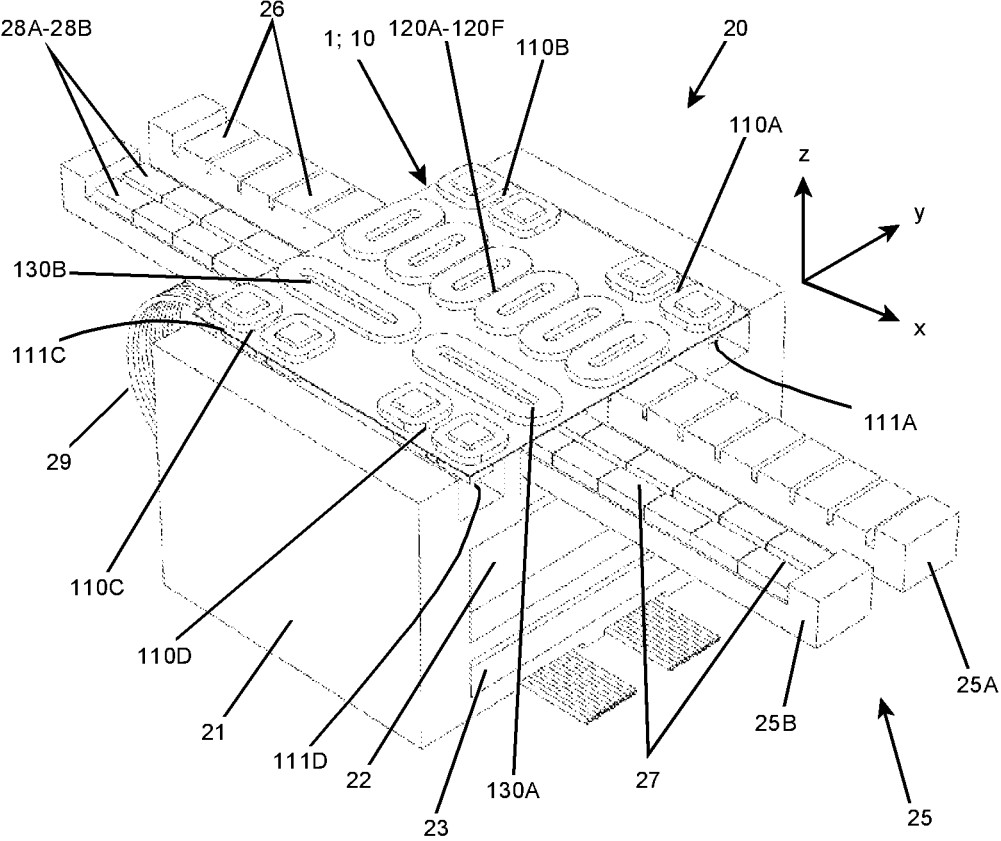
FIGS. 3A-3C several views of an embodiment of a positioning system according to the invention.
Figure 3B:
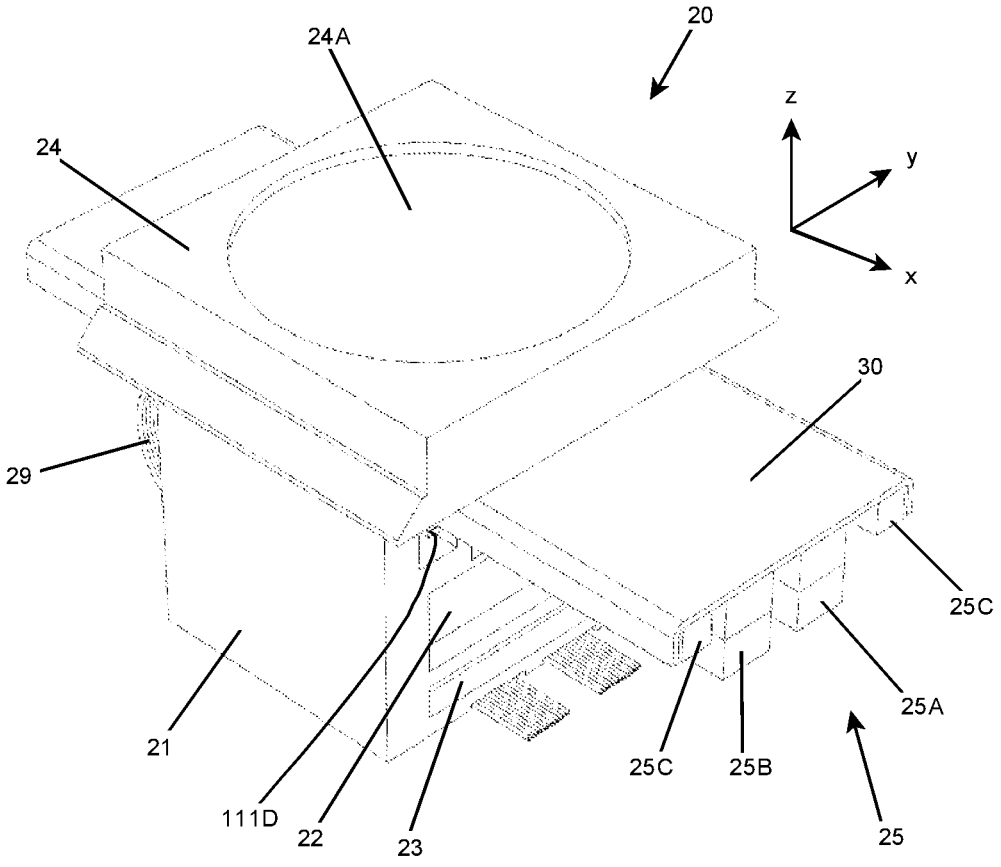
Figure 3C:
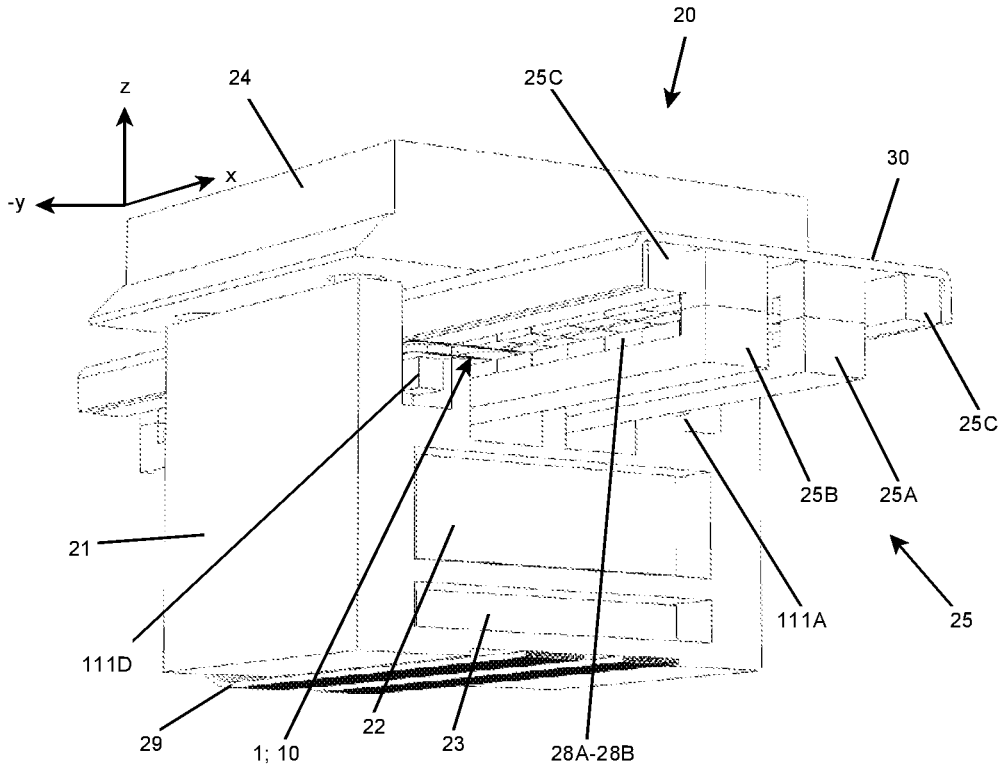

In FIGS. 2A-2D several coil configurations of the coil assemblies of the first (FIG. 2D), second and third (FIGS. 2A-2C) groups of coil assemblies are depicted. In FIGS. 2A-2C each coil assembly (120A-120F; 130A-130B) being part of the second group 120 and third group 130 of coil assemblies is composed of multiple single winded coils 18A (FIG. 2A), which are stacked together, e.g. being composed of a stack of six single coils 18A-18F (FIG. 2B). This design guarantees a low thermal resistance, and results in a high fill factor coil and subsequently to a high accuracy as to motion and positioning.

Furthermore, each coil assembly 120A-120F; 130A-130B is accommodated in an insulated manner in each recess 12-13, for example by means of an enclosure 19 made of an electrical isolating material, such as a polyimide film material, which film material is folded and formed as a box 19 and positioned over or designed to accommodate the coil assembly 120A-120F; 130A-130B. Such polyimide film material is marketed under the trademark name Kapton™.

Via connecting guides 15A-15B-15C the several coil assemblies 110A-110D; 120A-120F; 130A-130B can be electrically connected to proper control circuitry of the position means 22 of the positioning system 20.

In yet another example as shown in FIG. 1D, at least the second group 120 and/or the third group 130 of the multiple coil assemblies 120A-120F; 130A-130B is provided with at least one temperature sensor 121 and 131 respectively. In particular the temperature sensor 121 and 131 can be a PTC-resistor. Herewith a proper temperature control can be achieved, further improving stability of operation and preventing malfunction and/or disturbances which might adversely affect the motion and the positioning of the actuator device 1 and product placed upon the actuator device 1.

To further improve the thermal characteristics of the carrier 10 and thus improve the operation thereof within the positioning system 20, in an example shown in FIG. 1C the carrier 10 is shown from its lower, second surface side 1B. It comprises at least one channel 16 provided in the second surface side 1B for a coolant as well as an inlet 16A and an outlet 18B provided at respective ends of the channel 16.

In particular, starting from the inlet 16A towards the outlet 16B, the channel 16 is in subsequent heat-exchanging contact with the first 110, the second 120 and the third 130 group of multiple coil assemblies. See the thicker, dashed arrows, which demonstrate the direction of flow of coolant through the channel 16 along the several groups of multiple coil assemblies 110-120-130.

In this example two channels 16-16' are provided, each having an inlet 16A and an outlet 16B for directing a coolant in subsequent heat-exchanging contact with the first 110, the second 120 and the third 130 group of multiple coil assemblies. When following the dashed arrows of the direction of flow, for each channel 16 (16') the coolant will pass via the first coil assemblies 110C-B (110D-A), then via or across the second coil assemblies 120D-E-F (120C-B-A) and finally across the third coil assembly 130B (130A), respectively.

However also one, single channel 16 for the coolant can be used for directing the coolant in subsequent heat-exchanging contact with all first 110, second 120 and third 130 group of multiple coil assemblies, in that flow sequence.

With this channel configuration it is emphasized to direct the coolant, which might be water, first over the group of multiple coil assemblies with the lowest heat dissipation, here the coil assemblies 110A-110D of the first group 110 of coil assemblies, subsequently directing the coolant along the longitudinal sides of the carrier-shaped actuator device 1 and finally over the further groups 120-130 of multiple coil assemblies 120A-120F; 130A-130B located in the centre or middle of the actuator device 1 between the first group of multiple coil assemblies 110A-110D, which further groups 120-130 of multiple coil assemblies have the highest heat dissipation during operation.

As depicted in FIG. 1E, the carrier 10 is provided with a cover plate (shielding plate) 14 placed on the first surface side 1A of the carrier 10 covering all recesses 11A-11D; 12; 13 of the first 11, second 12 and third 13 group of recesses as well as the several coil assemblies 110A-110D; 120A-120F; 130A-130B of the several groups 110-120-130 of coil assemblies. Hereto the carrier 10 is provided with several mounting openings 10A'-10D' near or at the corners. This allows for an easy assembly as well as maintenance of the actuator device 1.

In a specific functional embodiment different from the embodiment shown in FIG. 1C, the channel 16 (or channels 16-16') for the coolant is provided in a surface of the cover plate 14 facing the recesses 11-12-13 and the first surface side 1A of the actuator device 1/carrier 10. This embodiment is shown in FIG. 1F with the cover plate 14 mounted to the first surface side 1A of the carrier 10. The channel 16 for the coolant is depicted in light grey indicating that the channel 16 is provided, e.g. by means of machining, in the surface of the cover plate 14, which is not visible in the FIG. 1F, but which is facing towards the first (upper) surface side 1A (as in the embodiment shown in FIG. 1B).

Preferably the carrier 10 is of a rectangular shape (FIGS. 1A-1F), however also other shapes such as a square shape (FIG. 1G) are even effective and practical, in dependence on the product processing application.

It is noted that in FIGS. 1A-1F the actuator device 1 comprises three groups 11-12-13 of coil assemblies 110A-110D; 120A-120F; 130A-130B allowing the actuator 10 to be positioned in six degrees of freedom (DOF x, y, z, φ, ψ and θ).

In FIG. 1G another example of an actuator device 1' is shown wherein the first group 11 of coil assemblies 110A-110D at each carrier corner 10A-10D is omitted and the actuator device 1' comprises the second group 120 and third group 130 of coil assemblies, thus being structured to position the actuator device 1' in four degrees of freedom DOF x, y, ψ (rotation around y-axis) and θ (rotation around z-axis). So this embodiment has further limited constructional dimensions and yet allows high accuracy as to motion and position in less, but still multiple degrees of freedom, albeit for another type of process application.

According to the invention it should be noted, that the actuator device 1 at least comprises two groups of coil assemblies, in particular at least the groups 12 and 13 of coil assemblies 120 # and 130 #, respectively.

FIGS. 3A-3C and 4A-4E disclose several views and examples of a positioning system 20 for positioning an object in a plane, the system 20 comprising a supporting structure 25; an object table 24; a positioning module or positioning means 22 and an actuator device 1 as depicted in any one or more of the FIGS. 1A-1G. The actuator device 1 is structured to support the object table 24, and the positioning module or metrology parts 22 is structured to linearly move the actuator device 1 together with the object table 24 within a XY-plane with respect to the supporting structure 25.

In particular the positioning module or metrology parts 22, the actuator device 1 and the product table 24 are mounted in a positioning frame 21, which additionally can be provided with additional mass or auxiliary means 23, for example for cooling, supporting stability and accuracy of the actuator 1 during operation.

The object table 24 serves to support a (not shown) substrate wafer or similar product, which is to be subjected for example to photolithography process steps in a process chamber 31 (see FIG. 4D), which process steps require extreme high accuracy as to motion and positioning under vacuum conditions. The object table 24 can be provided with a recess 24A for accommodating a substrate wafer.

The supporting structure 25 or solid world comprises a first 25A and a second 25B elongated guide, which guides 25A-25B are orientated parallel to each other within the positioning system. Both first 25A and second 25B elongated guides comprise first 26 and second 27 groups of magnets positioned next to each other in opposite pole orientation. Each second group of magnet assemblies 27 is composed of two individual magnets 28A-28B.

Preferably the magnets 26; 28A-28B are permanent magnets or electromagnets. During operation, the first 26 and second 27 group of magnets of the first 25A and second 25B elongated guides interact with the second 120 and third 130 group of coil assemblies of the actuator device, respectively, thus acting as permanent magnet Lorentz actuators. In particular the first group 26 of magnets of the first elongated guide 25A interact with the second 120 group of coil assemblies 120A-120F thus allowing the movement and positioning of the actuator 1 and the product table 24 in the x-direction along the longitudinal orientation of the elongated guides 25A-25B (degree of freedom x).

The second group 27; 28A-28B of magnets of the second elongated guide 25B interact with the third 130 group of coil assemblies 130A-130B thus allowing the movement and positioning of the actuator 1 and the product table 24 in the y-direction (degree of freedom y).

By accommodating the positioning module/metrology parts 22, the actuator device 1 and the product table 24 in the positioning frame 21, the positioning frame 21 is movable with respect to the supporting structure 25 by means of the positioning module 22 due to the interaction of the several coil assemblies of the second 120 and third 130 group in at least the xy-plane (two DOF x and y). Additionally, independent control of the two coil assemblies 130A-130B of the third group of coil assemblies also allow torsional orientation of the actuator device 1 and the product table 24 around its z-axis (DOF θ).

A cable slab 29 is provided close to the center of mass of the positioning frame 21, thus minimizing signal disturbances and vibration.

Also, the solid world or supporting structure 25 is provided with two additional elongated guides 25C, which are located at respective opposite sides of the positioning system 20, with the first and second elongated guides 25A-25B in between. The elongated guides 25A-25B-25C are made from a ferromagnetic material for proper interaction with the first 110, second 120, and third 130 group of coil assemblies. In particular, the additional guides 25C interact with the U-yoke coil assemblies 110A-110D of the first group 110 of coil assemblies allowing orientation of the actuator device 1 and the product table 24 in the z-direction (DOF z). Additionally, independent control of the coil assemblies 110A-

110D of the first group of coil assemblies also allow bending orientation of the actuator device 1 and the product table 24 in the φ (rotation around the x-axis direction) degree of freedom and w (rotation around the y-axis direction) degree of freedom.

The elongated guides 25A-25B-25C are covered by a magnetic shielding plate 30, shielding the product table 24 and the substrate wafer (not shown) positioned in the recess 24A thereof from any electro-magnetic interference from the magnets 26; 27-28A-28B and the actuator device 1.

Reference numerals 32A-32D depict yoke connectors connected to the yokes 111A-111D of the U-yoke coil assemblies 110A-110D of the first 110 group of coil assemblies. These yoke connectors 32A-32D form the mechanical connection between the actuator device 1 (and the product table 24) with the positioning frame 21 allowing the displacement of the actuator device 1 (and the product table 24) together with the positioning frame 21 along the elongated guides 25A-25B-25C.

Figure 4A:
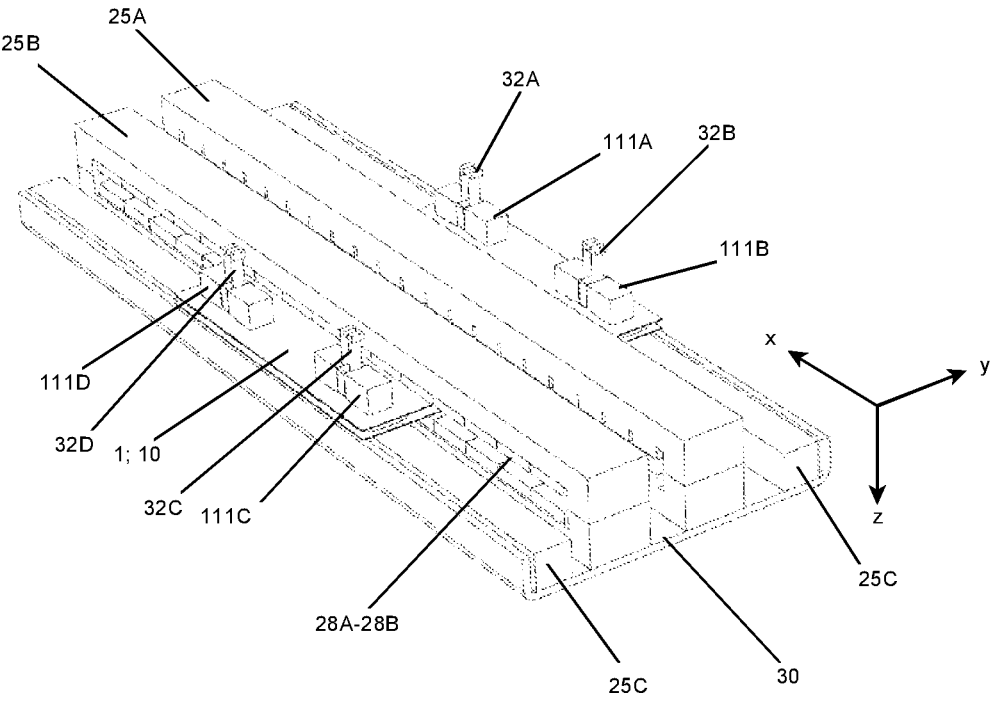
FIGS. 4A-4E further views of the embodiment of the positioning system according to the invention.
Figure 4B:
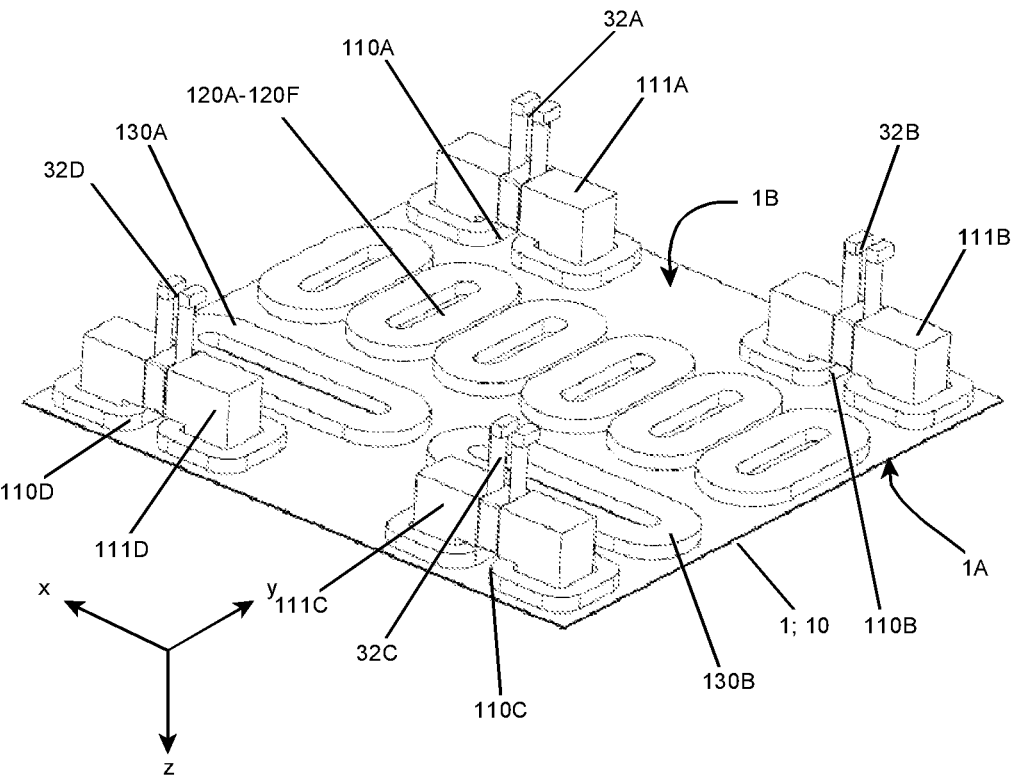
Figure 4C:
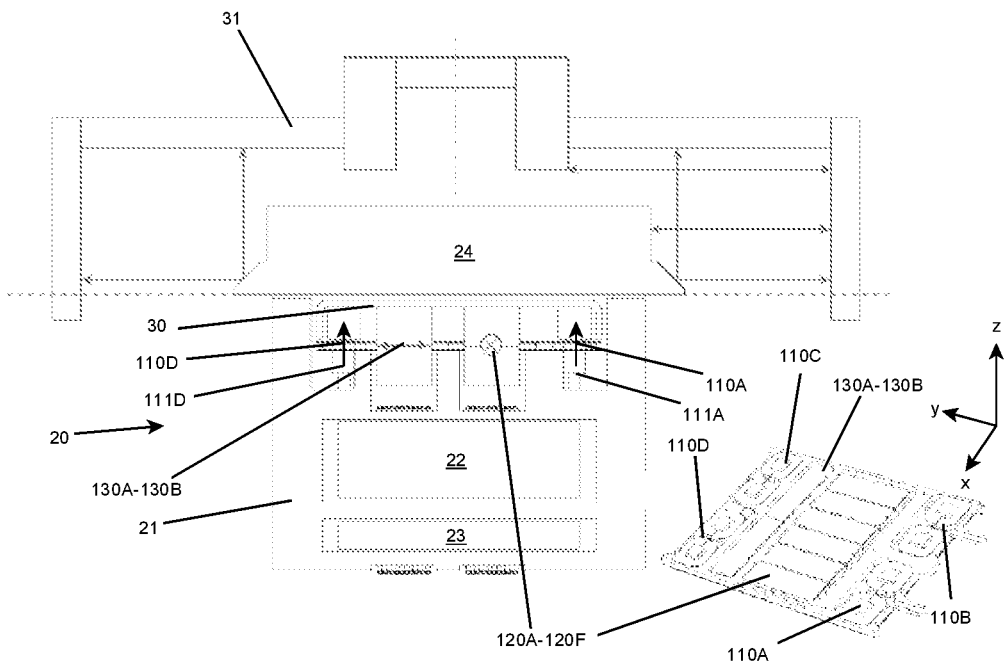

FIGS. 4A-4C depict a positioning system 20 provided with an actuator device 1 according to FIGS. 1A-1D, hence with three groups 110-120-130 of coil assemblies allowing the positioning of the carrier 10 and the product table 24 in six degrees of freedom (six DOF x, y, z, φ, ψ and θ).

Figure 4D:
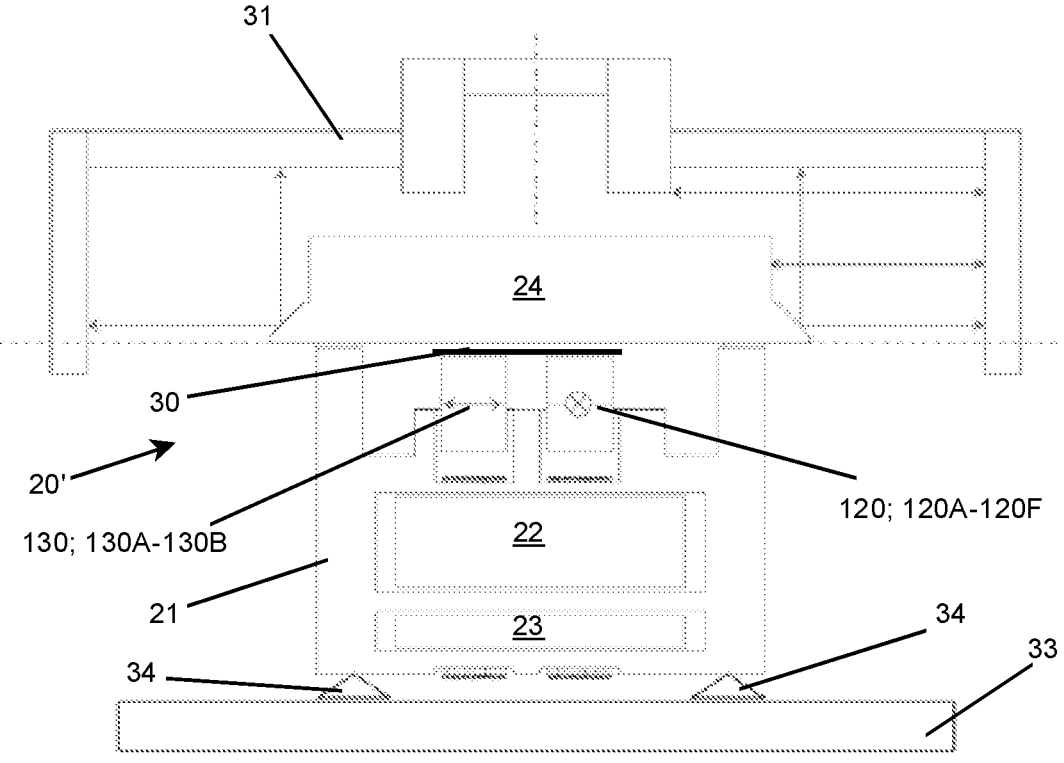
Figure 4:
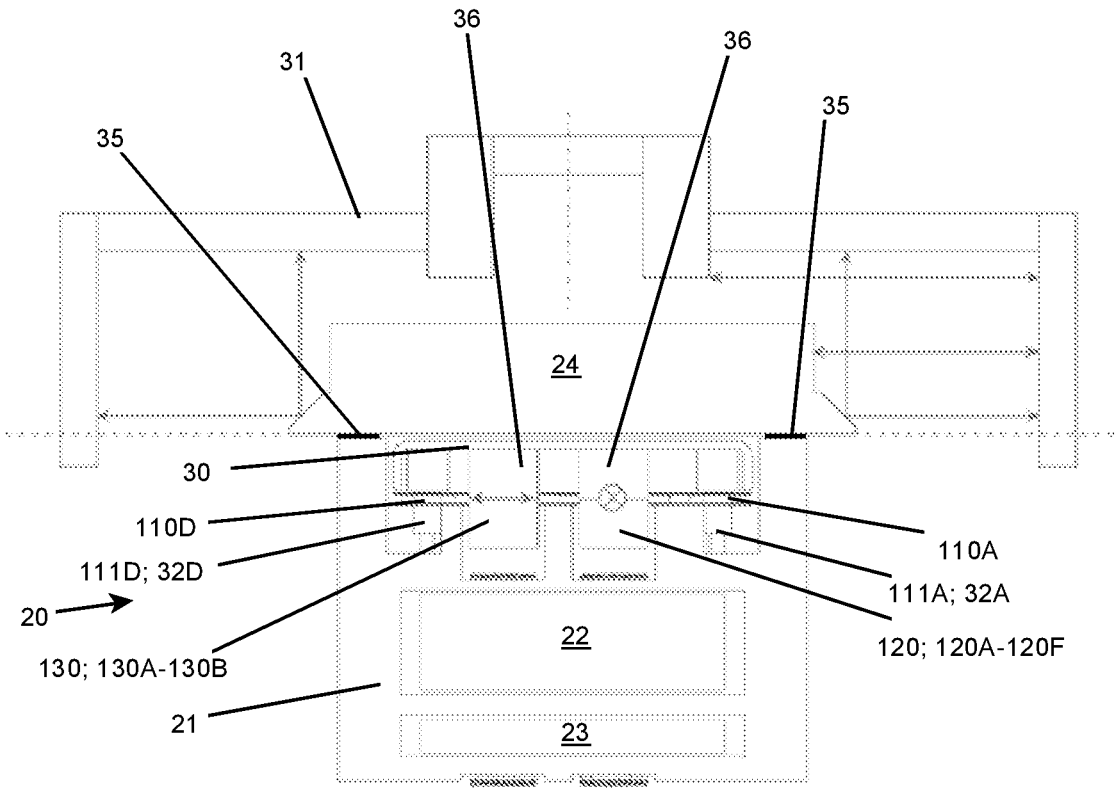

FIG. 4D depicts a positioning system 20 of a simplified design as it is provided with an actuator device 1 according to FIG. 1G, hence with only two groups 120-130 of coil assemblies allowing the positioning of the carrier 10 in four degrees of freedom DOF x, y, ψ (rotation around y-axis) and θ (rotation around z-axis). The absence of the first group 110 of coil assemblies 110A-110D means that the z-direction actuators are absent. To compensate for this limited motion control air bearings 34 are provided between the positioning system 20 and the ground floor 33, thus minimizing any vibrations in the z-direction.

FIG. 4E depicts a positioning system 20 of a design more or less similar as the FIGS. 4A-4D, also incorporating the three groups 110-120-130 of coil assemblies allowing the positioning of the carrier 10 and the product table 24 in six degrees of freedom (six DOF x, y, z, φ, ψ and θ). Additionally, passive damping elements 35 are disposed between the positioning frame 21 and the object table 24 to avoid high frequent undamped vibration in the metrology path. Passive damping enables higher servo bandwidth further improving the accuracy of the positioning system 20, in particular the metrology parts 22. Additionally, reference numerals 36 denote additional balance mass bodies mounted in the positioning system 20 to avoid excitation of the column and metrology parts 22.

In the examples described above an improved actuator device is achieved integrating multiple groups of coil assemblies in one, single carrier. This single design with the several groups of actuating coil assemblies allows for both a direct motion axis as well as dual motion axis, in particular allows for the positioning of the carrier and the product table in six degrees of freedom (six DOF x, y, z, φ, ψ and θ). As outlined in the detailed description, with the six degrees of movements it is meant motion in the x, y, z directions/axis as well as rotations around the x, y, and z axis. With direct motion is meant, decentral control of motion in one axis direction, using one position sensor and control in the same direction. With dual motion control is meant, motion in one direction/axis for the less accurate displacement and positioning, whereas motion in another direction/axis serves for the more accurate control.

Additionally, the integrated cooling and thermal sensors, preserves the thermal characteristics of the carrier as to heat dissipation and cooling, which in turn support the mechanical stability and movement accuracy of the actuator during operation.

The six degrees of freedom design using the several groups of actuating coil assemblies allows displacement of the carrier to conduct long stroke movements in a single direction, typically the x-direction, and short stroke movements in the other DOF directions.

Although the actuator device according to the invention and described herein, can be implemented in product processing applications under high or low vacuum (or clean room) conditions, for example in wafer handling applications in the semiconductor manufacturing industry, it is noted that wafer handling applications are not to be considered a limitation. The actuator device according to the invention can also be used in other applications, where motion and positioning of a carrier or product are critical for the performance of such application.

In particular the actuator device can also be used in a positioning system as defined in the claims, wherein the positioning system is configured as a scanning system, wherein the actuator device is movable with a constant velocity within a plane in six degrees of freedom with respect to a supporting structure of the scanning system. Herewith, the control system of the positioning (scanning) system can thus accurately control the several coil assemblies of the actuator device, in which the intended movement of the actuator device through the system can be monitored very closely.

Such positioning system and/or scanning system may implement vibration reduction or isolation functionality by means of spring-damper systems (air bearings) between the metrology frame and the surrounding construction as well as the solid world. For example, the scanning and positioning system may contain a balance mass structure to minimize actuation induced vibrations into the metrology frame.

REFERENCE NUMERALS USED IN THE FIGURES 1 actuator device
1A first surface side
1B second surface side
10 carrier body
10A-10D carrier corner
10A'-10D' mounting holes
11 first group of recesses
11A-11D individual recesses belonging to the first group of recesses
110 first group of coil assemblies
110A-110D first coil assemblies belonging to the first group of coil assemblies
110 #1-110 #2 coil sections of first coil assembly 110 #(with # being A-D)
111A-111D yokes of first coil assemblies
111 #1-111 #2 yoke legs of yoke 111 #(with # being A-D)
113 #1-113 #2 winding core for coil sections 110 #1-110 #2 (with # being A-D)
114 wire connection between coil sections 110 #1-110 #2 (with # being A-D)
115 #1-115 #2 winding core opening of winding core 113 #1-113 #2 (with # being A-D)
12 second group of recesses
120 second group of coil assemblies
120A-120F second coil assemblies belonging to the second group of coil assemblies 121 temperature sensor of second group of coil assemblies
13 third group of recesses
130 first group of coil assemblies
130A-130B third coil assemblies belonging to the third group of coil assemblies
131 temperature of third group of coil assemblies
14 closure plate or shielding plate
15A-15B-15C connecting guides for several coil assemblies
16 coolant channel
16A coolant channel inlet
16B coolant channel outlet
17A-17D through openings in first group of recesses
17 #1-17 #2 through opening for yoke leg 111 #1-111 #2 of yoke 111 #(with # being A-D)
18A-18F individual winded coil of second and third group of coil assemblies
19 electrically isolated pocket for second and third group of coil assemblies
20 positioning system
21 positioning frame
22 positioning means/metrology parts
23 additional mass or auxiliary means
24 object table
24A recess in surface of object table
25 supporting structure or solid world
25A first elongated guide of supporting structure
25B second elongated guide of supporting structure
25C third elongated guide of supporting structure
26 first magnet assembly
27 second magnet assembly
28A-28B individual magnets of second magnet assembly
29 signal cable slab
30 magnetic shielding plate
31 processing chamber
32A-32D yoke connectors
33 ground floor
34 air bearing
35 passive damping element
36 balance mass body

The invention claimed is:

1. An actuator device for use in a positioning system, wherein the actuator device is linearly movable within a plane with respect to a supporting structure of the positioning system, the actuator device comprising:
a carrier having a longitudinal and a transversal dimension;
multiple groups of coil assemblies mounted in the carrier, each group of coil assemblies being structured to orientate the carrier in at least one degree of freedom, wherein the carrier is provided with multiple groups of one or more recesses, each group of one or more recesses structured to accommodate one or more coil assemblies belonging to one group of the multiple groups of coil assemblies,
wherein the carrier comprises a channel for a coolant as well as an inlet and an outlet provided at respective ends of the channel,
wherein the carrier is provided with a cover plate covering all recesses of first, second, and third group of recesses.

2. The actuator device according to claim 1, wherein a first group of one or more recesses consist of four corner recesses, each corner recess being provided at or near a corner of the carrier.

3. The actuator device according to claim 2, wherein each corner recess is provided with two through openings.

4. The actuator device according to claim 3, wherein each corner recess is structured to accommodate a U-core coil assembly of a first group of the multiple groups of coil assemblies, with each yoke of the U-core mounted through one of the corner through openings extending outward from a carrier surface and with a coil assembly of the first group of coil assemblies mounted around each yoke of the U-core.

5. The actuator device according to claim 4, wherein a second group and a third group of one or more recesses for accommodating a second and third group of the multiple groups of coil assemblies, respectively, are provided adjacent from each and between the first group of corner recesses, seen in the longitudinal dimension of the carrier.

6. The actuator device according to claim 5, wherein, starting from the inlet towards the outlet, the channel is in subsequent heat-exchanging contact with the first, the second and the third group of the multiple groups of coil assemblies.

7. The actuator device according to claim 6, wherein the second group and/or the third group of one or more recesses consist of one recess.

8. The actuator device according to claim 6, wherein the recesses of both the second and third group have a longitudinal dimension orientated parallel to the transversal dimension of the carrier.

9. The actuator device according to claim 1, wherein each coil assembly is accommodated in an insulated manner in each recess of a group recesses.

10. The actuator device according to claim 1, wherein each coil assembly is composed of a group of multiple single winded coils stacked together.

11. The actuator device according to claim 1, wherein at least the second and/or the third group of the multiple groups of coil assemblies is provided with at least one temperature sensor, in particular a PTC-resistor.

12. The actuator device according to claim 1, wherein the channel is provided in a surface of the cover plate facing the recesses.

13. The actuator device according to claim 1, wherein the carrier is of a rectangular shape.

14. A positioning system for positioning an object in a plane, the system comprising a supporting structure; an object table; a positioning module and an actuator device according to claim 1, wherein the actuator device is structured to support the object table, and wherein the positioning module is structured to linearly move the actuator device together with the object table within a plane with respect to the supporting structure.

15. The positioning system according to claim 14, wherein the supporting structure comprises a first and a second elongated guide orientated parallel to each other, both first and second elongated guides comprising first and second groups of magnets positioned next to each other in opposite pole orientation.

16. The positioning system according to claim 14, wherein magnets are provided that are permanent magnets or electromagnets.

17. The positioning system according to claim 14, wherein, during operation, a first and second group of magnets of a first and second elongated guides interact with the second and third group of coil assemblies of the actuator device, respectively.

18. The positioning system according to claim 14, wherein the positioning module, the actuator device and product table are accommodated in a positioning frame, which positioning frame is movable with respect to the supporting structure by means of the positioning module.

19. The positioning system according to claim 14, wherein damping elements are disposed between a positioning frame and the object table.

20. The positioning system according to claim 14, wherein air bearings are disposed between the supporting structure and ground floor.

* * * * *